(12) United States Patent
Ahn

(10) Patent No.: US 6,788,230 B2
(45) Date of Patent: Sep. 7, 2004

(54) MULTI-CHANNEL A/D CONVERTER AND SYSTEM USING THE SAME

(75) Inventor: Young-jun Ahn, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/350,331

(22) Filed: Jan. 24, 2003

(65) Prior Publication Data

US 2003/0164783 A1 Sep. 4, 2003

(30) Foreign Application Priority Data

Jan. 29, 2002 (KR) .......................................... 2002-5197

(51) Int. Cl.[7] .............................................. H03M 1/20
(52) U.S. Cl. ...................................... 341/131; 341/157
(58) Field of Search ................................. 341/131, 155, 341/157, 120, 161, 162, 141, 110, 136

(56) References Cited

U.S. PATENT DOCUMENTS 6,304,205 B1 * 10/2001 Rezvani et al. ............. 341/161
6,590,517 B1 * 7/2003 Swanson .................... 341/155

* cited by examiner

Primary Examiner—Brian Young
Assistant Examiner—Joseph Lauture
(74) Attorney, Agent, or Firm—Staas & Halsey LLP (57) ABSTRACT

A multi-channel analog/digital (A/D) converter and a system includes a programmable memory on which a channel selection order is recorded, a channel selection unit which selects one of multiple channels according to the channel selection order recorded on the programmable memory, and a converting unit which converts an analog signal of the selected channel into digital data. With the A/D converter, a channel selection order and a sampling rate can be changed without changing the setup of hardware, and time delay can be reduced.

34 Claims, 10 Drawing Sheets

| FRAME NUMBER | F0 | F1 | F2 | F3 | F4 | F5 | F6 | F7 | F8 | F9 | F10 | F11 | F12 | F13 | F14 | F15 |
|---|---|---|---|---|---|---|---|---|---|---|---|---|---|---|---|---|
| Slot0 | 1 | 1 | 1 | 1 | 1 | 1 | 1 | 1 | 1 | 1 | 1 | 1 | 1 | 1 | 1 | 1 |
| Slot1 | 2 | 3 | 4 | 5 | 2 | 3 | 4 | 6 | 2 | 3 | 4 | 7 | 2 | 3 | 4 | 6 |
| Slot2 | 0 | 0 | 0 | 0 | 0 | 0 | 0 | 0 | 0 | 0 | 0 | 0 | 0 | 0 | 0 | 0 |

FIG. 8

| SET VALUE | 0 | 1 | 2 | 3 | 4 | 5 | 6 | 7 |
|---|---|---|---|---|---|---|---|---|
| FREQUENCY DIVISION RATIO | 255 | 272 | 288 | 304 | 320 | 336 | 352 | 368 |
| SET VALUE | 8 | 9 | 10 | 11 | 12 | 13 | 14 | 15 |
| FREQUENCY DIVISION RATIO | 384 | 400 | 416 | 432 | 448 | 464 | 480 | 496 |
| SET VALUE | 16 | 17 | 18 | 19 | 20 | 21 | 22 | 23 |
| FREQUENCY DIVISION RATIO | 512 | 528 | 544 | 560 | 576 | 592 | 608 | 624 |
| SET VALUE | 24 | 25 | 26 | 27 | 28 | 29 | 30 | 31 |
| FREQUENCY DIVISION RATIO | 640 | 656 | 672 | 688 | 704 | 720 | 736 | 752 |

MULTI-CHANNEL A/D CONVERTER AND SYSTEM USING THE SAME

CROSS REFERENCE TO RELATED APPLICATION

This application claims the priority of Korean Patent Application No. 2002-005197, filed in the Korean Intellectual Property Office on Jan. 29, 2002, the disclosure of which is incorporated herein in its entirety by reference.

BACKGROUND OF THE INVENTION

1. Field of the Invention

The present invention relates to a multi-channel A/D converter, and more particularly, to an A/D converter which converts analog signals, each of which is input through one of a plurality of channels, into digital signals, and a signal processing apparatus, an optical disc drive, and a reproducing apparatus using the same.

2. Description of the Related Art

An A/D converter is used to convert an analog signal into a digital signal, and is a component that is installed in most digital apparatuses. In particular, a multi-channel A/D converter is a device which converts a plurality of analog signals, which are input through a plurality of channels, into digital signals using a time-division method in one A/D converter. The multi-channel A/D converter and a signal processing apparatus having the same are used particularly in a disc drive for recording predetermined information on a disc, or reproducing information recorded on a disc, and in a reproducing apparatus having the disc drive.

In a disc, a variety of signal sources are prepared so as to control recording/reproducing of information. A pickup generates a variety of analog signals used in controlling the pickup from the disc. Those analog signals include a focusing signal, which is used to control the focusing of an optical spot that is directed from the pickup to the disc, a tracking signal, which is used to control the tracking, and other RF signals.

In the conventional A/D converter, a sampling rate is fixed for each channel. That is, a channel selection order (sampling rate by channel) is stored in a memory formed with ROMs. If a user desires to later change the sampling rate for a channel, the hardware setup needs to be changed. Also, when a time slot that is obtained based on a system clock is used in time division, and when the A/D converting result is read for each channel, unless the result is read immediately after the completion of conversion, there occurs a time delay of a time slot interval.

SUMMARY OF THE INVENTION

To solve the above and other problems, it is an object of the present invention to provide a multi-channel A/D converter which changes a channel selection order and a sampling rate without changing the hardware setup, and a system using the same.

It is another object of the present invention to provide a multi-channel A/D converter which reduces a time delay, and a system using the same.

It is a further object of the present invention to provide a multi-channel A/D converter which has an operation mode that reduces the time delay, and a system using the same.

Additional objects and advantages of the invention will be set forth in part in the description which follows and, in part, will be obvious from the description, or may be learned by practice of the invention.

To accomplish the above and for other objects, there is provided a multi-channel Analog/Digital (A/D) converter according to an embodiment of the invention that includes a programmable memory on which a channel selection order is recorded, a channel selection unit which selects a channel according to the channel selection order recorded on the programmable memory, and a converting unit which converts an analog signal of the selected channel into digital data.

According to an aspect of the invention, the channel selection unit comprises a synchronization signal generator which generates a synchronization signal, and a channel selection controller which outputs a channel selection signal referring to the channel selection order recorded on the programmable memory, based on the synchronization signal.

According to another aspect of the invention, the converting unit comprises a multiplexer which receives an analog signal corresponding to one of a plurality of channels, and outputs an analog signal corresponding to a channel based on the channel selection signal, and an A/D converter which converts the analog signal output from the multiplexer into digital data.

According to yet another aspect of the invention, the synchronization signal generator generates a synchronization signal at each cycle of an A/D clock prepared in the A/D converter, or generates a synchronization signal at each slot corresponding to an integer multiple of the A/D clock cycle.

According to still another aspect of the invention, the synchronization signal generator generates a synchronization signal at each cycle of an A/D clock in an automatic A/D clock mode, and generates a corresponding synchronization signal at each slot corresponding to an integer multiple of a system clock in an automatic slot mode.

According to still yet another aspect of the invention, the synchronization signal generator is disabled in a manual mode, and the channel selection controller outputs a channel selection signal according to channel selection information provided by a signal processor, and, if the synchronization signal is input, the channel selection controller outputs an address of a channel corresponding to the signal as a channel selection signal.

According to another embodiment of the invention, the multi-channel A/D converter is achieved by a chip on which the multi-channel A/D converter mounted, a disc drive in which the chip is embedded, or a reproducing apparatus in which the disc driver is installed.

According to a further embodiment of the invention, a signal processing apparatus includes an A/D converter which comprises a programmable memory on which a channel selection order is recorded, a channel selection unit which selects a channel according to the channel selection order recorded on the programmable memory, a converting unit which converts an analog signal of the selected channel into digital data, and a storage unit which stores the converted digital data; and a digital signal processor which reads digital data stored in the storage unit, processes the data, and outputs a predetermined signal.

According to an aspect of the invention, the channel selection order stored in the programmable memory is changed using the digital signal processor.

According to another aspect of the invention, the channel selection order stored in the programmable memory is changed by changing firmware, and the digital signal processor executes portions of the firmware.

According to a further aspect of the invention, the channel selection unit comprises a synchronization signal generator which generates a synchronization signal, and a channel selection controller which generates a channel selection signal referring to the channel selection order recorded in the programmable memory, based on the synchronization signal.

According to a yet further aspect of the invention, the converting unit comprises a multiplexer which receives an analog signal corresponding to each of a plurality of channels, and outputs an analog signal of a channel based on the channel selection signal, and an A/D converter which converts an analog signal output from the multiplexer into a digital signal.

According to a still further aspect of the invention, the synchronization signal generator generates a synchronization signal at each cycle of the A/D clock prepared in the A/D converter, or generates a synchronization signal at each slot corresponding to an integer multiple of the A/D clock cycle.

According to a still yet further aspect of the invention, the synchronization signal generator generates a synchronization signal at each cycle of an A/D clock in an automatic A/D clock mode, and generates a corresponding synchronization signal at each slot corresponding to an integer multiple of a system clock in an automatic slot mode, and is disabled in a manual mode, and the channel selection controller outputs a channel selection signal according to channel selection information provided by a signal processor.

According to an additional aspect of the invention, if the synchronization signal is input, the channel selection controller outputs an address of a channel corresponding to the signal as a channel selection signal.

According to an additional embodiment of the invention, the multi-channel A/D converter is achieved by a chip on which any one apparatus is mounted, a disc drive in which the chip is embedded, or a reproducing apparatus in which the disc drive is installed.

BRIEF DESCRIPTION OF THE DRAWINGS

The above and other objects and advantages of the present invention will become more apparent and more readily appreciated by describing in detail embodiments thereof with reference to the accompanying drawings in which.

DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
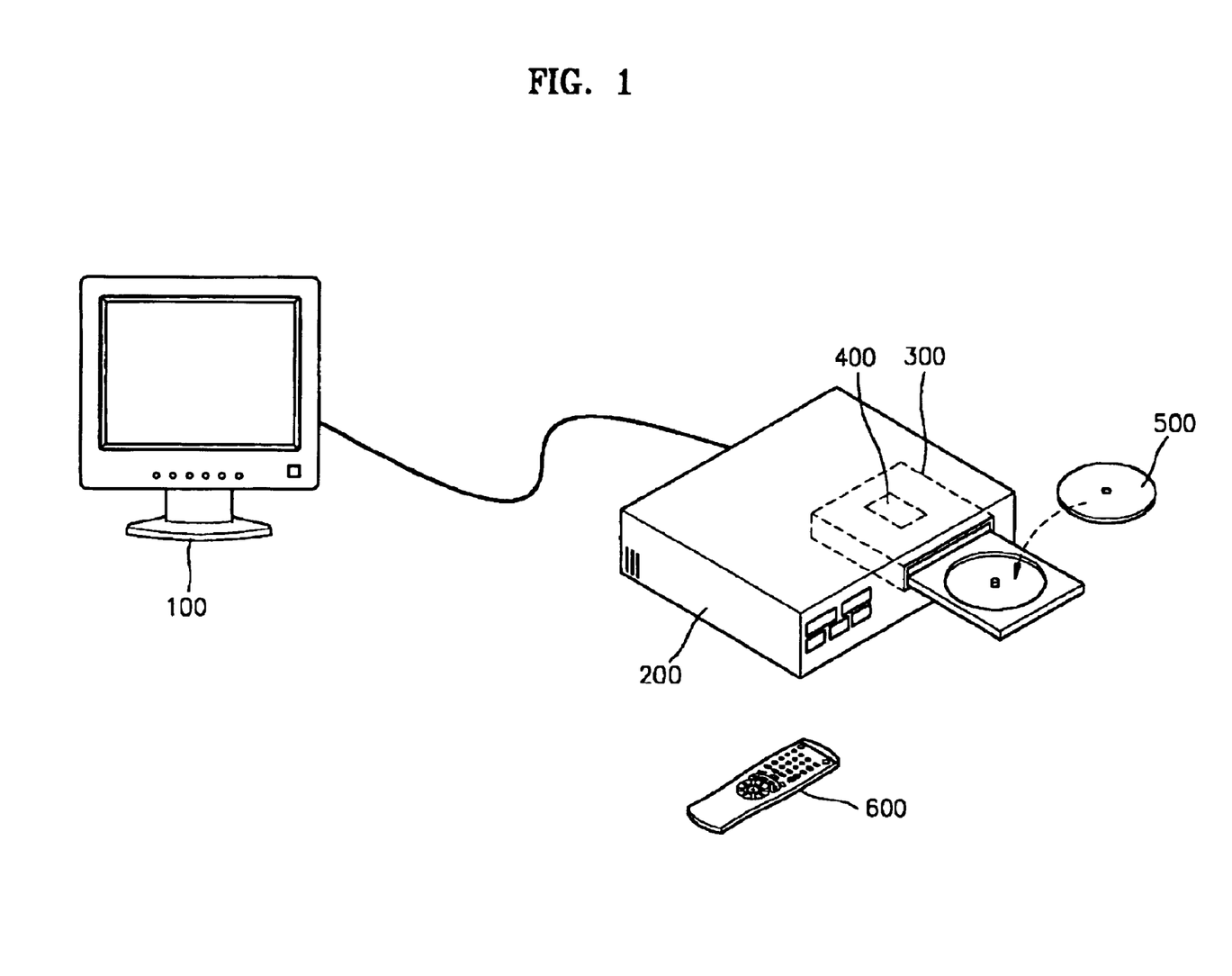
FIG. 1 is a schematic diagram of a reproducing system according to an embodiment of the present invention.

Referring to the embodiment shown in FIG. 1, a reproducing system includes a TV 100 as a display apparatus and a disc player 200 as a reproducing apparatus. The disc player 200 has an optical disc drive 300 having a disc deck on which is placed an optical disc 500 as an information storing medium. The optical disc drive 300 has a pickup 4 (shown in FIG. 4) which detects a predetermined analog signal from the optical disc 500, or generates a predetermined analog signal from the signal detected from the optical disc 500. A signal processing apparatus 400 converts the analog signal into digital data, processes the digital data, and outputs a predetermined signal. The signal processing apparatus 400 has a multi-channel A/D converter (shown in FIG. 5) according to the present invention.

A user manipulates the reproducing apparatus 200 and display apparatus 100 with a remote controller 600 on which a variety of manipulation buttons are arranged. If the user requests the reproduction of content data recorded on a predetermined track of the optical disc 500, the optical disc drive 300 moves the pickup to the requested track, reads the content data, decodes the content data, and sends the data to the display apparatus 100. In the present embodiment, the display apparatus 100, which is implemented as a TV or a monitor, displays the signal sent by the reproducing apparatus 200, on the screen.

Figure 2:
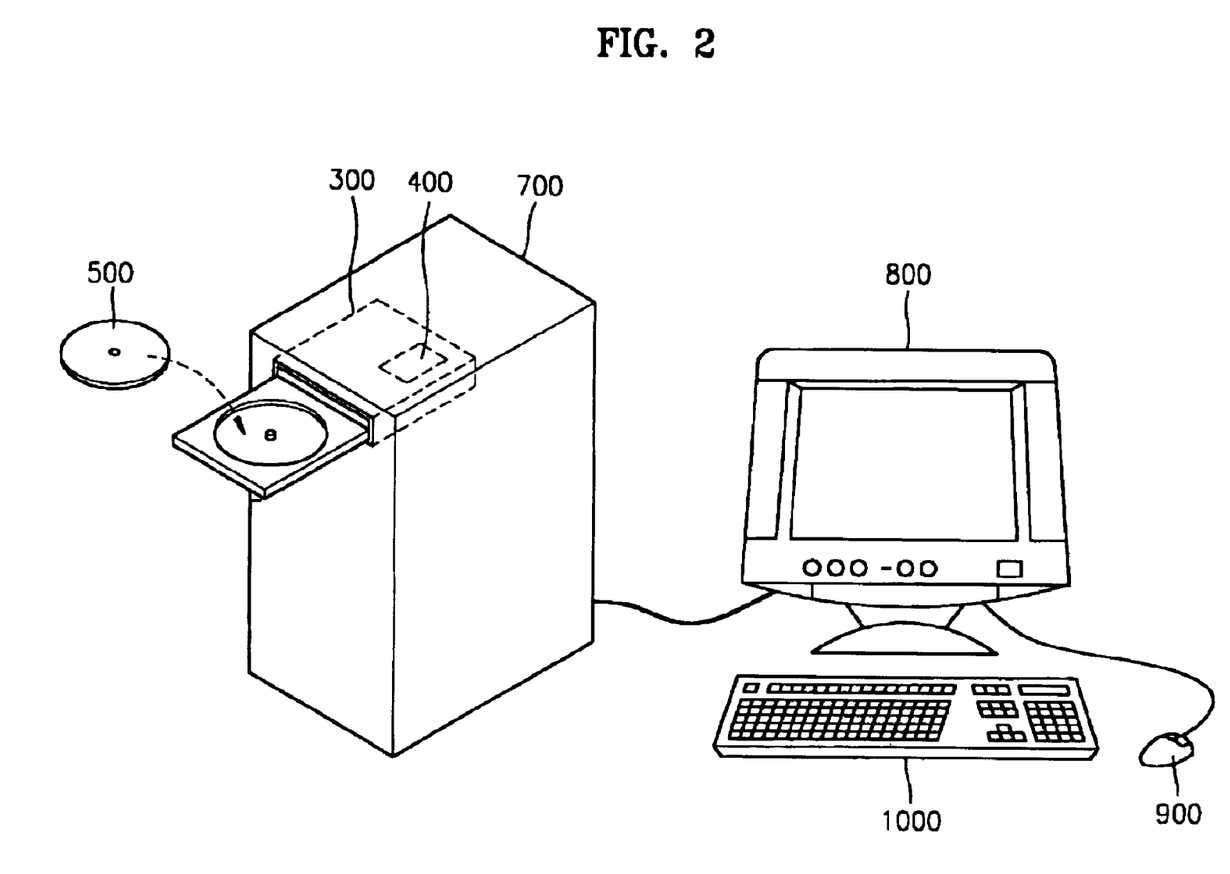
FIG. 2 is a schematic diagram of a reproducing system according to another embodiment of the present invention.

FIG. 2 is a schematic diagram of a reproducing system according to another embodiment of the present invention. Like reference numbers are used for items having the same functions as in FIG. 1. Referring to FIG. 2, the reproducing system has a monitor 800 as a display apparatus, and a computer main body 700 as a reproducing apparatus. The computer main body 700 has an optical disc drive 300 having a disc deck on which is placed an optical disc 500. The optical disc drive 300 has a pickup 4 (shown in FIG. 4) which detects a predetermined analog signal from the optical disc 500, or generates a predetermined analog signal from the signal detected from the optical disc 500. A signal processing apparatus 400 converts the analog signal into digital data, processes the digital data, and outputs a predetermined signal. The signal processing apparatus 400 has a multi-channel A/D converter (shown in FIG. 5) according to the present invention.

If the user requests the reproduction of content data recorded on the optical disc 500 with an input device, such as a keyboard 1000 or a mouse 900, the optical disc drive 300 moves the pickup 4 to the requested track. The optical disc drive 300 reads the content data, decodes the content data, and sends the data to the monitor 800. In the present embodiment, the monitor 800 displays the signal sent from the computer main body 700 on the screen.

Figure 3:
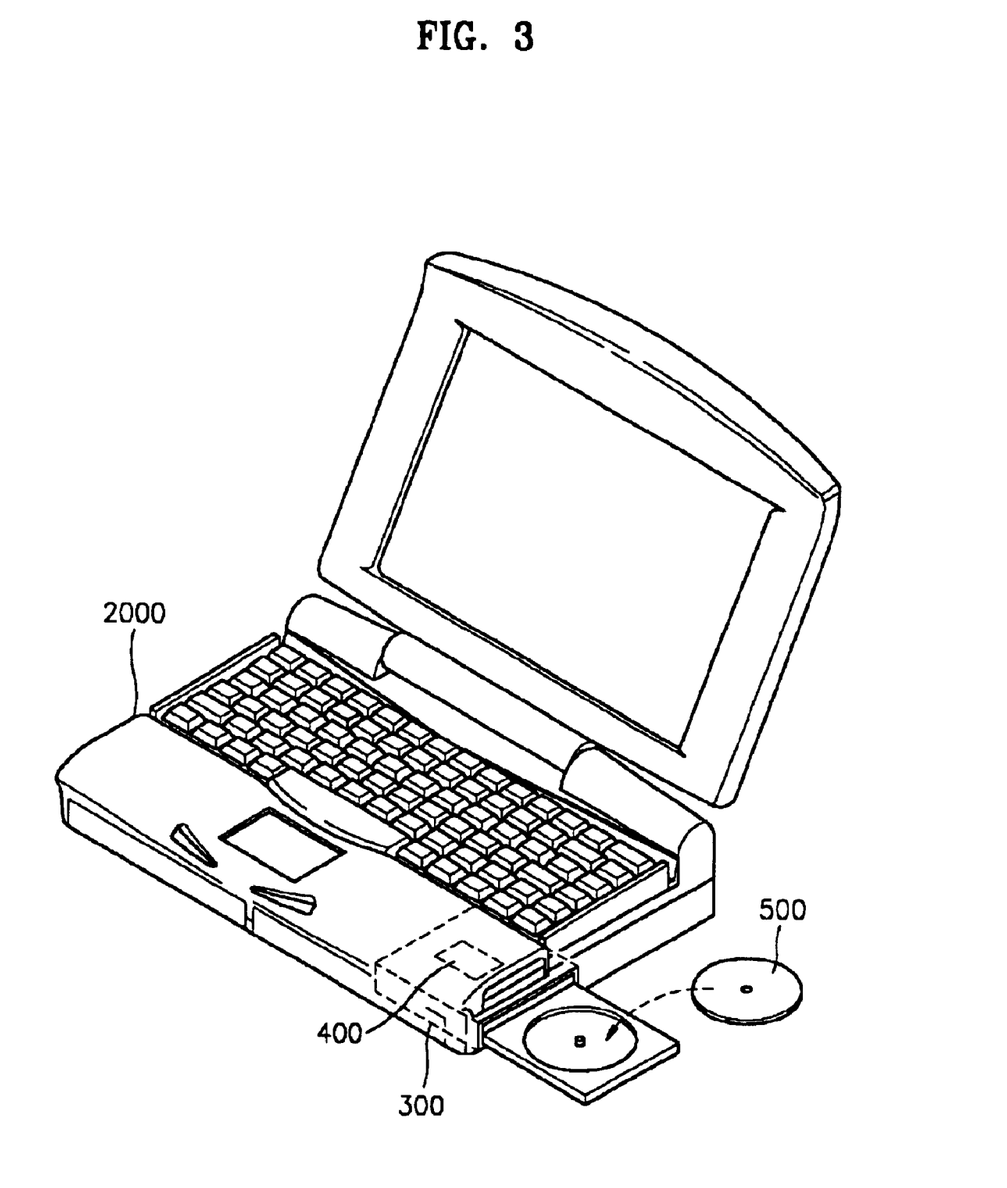
FIG. 3 is a schematic diagram of a reproducing system according to a further embodiment of the present invention.

FIG. 3 is a schematic diagram of a reproducing system according to a further embodiment of the present invention.

Like reference numbers are used for items having the same functions as in FIG. 1. Referring to FIG. 3, the reproducing system is implemented as a notebook computer 2000 integrating a display apparatus and a reproducing apparatus in one body. The notebook computer 2000 has an optical disc drive 300 having a disc deck on which is placed an optical disc 500. The optical disc drive 300 has a pickup 4 (shown in FIG. 4) which detects a predetermined analog signal from the optical disc 500, or generates a predetermined analog signal from the signal detected from the optical disc 500. A signal processing apparatus 400 converts the analog signal into digital data, processes the digital data, and outputs a predetermined signal. The signal processing apparatus 400 has a multi-channel A/D converter (shown in FIG. 5) according to the present invention.

If the user requests the reproduction of content data recorded on the optical disc 500 with an input apparatus of the notebook computer 2000, such as a touch pad (not shown) or a keyboard (not shown), the optical disc drive 300 moves the pickup 4 (shown in FIG. 4) to the requested track, reads the content data, decodes the content data, and displays the content data on the screen.

Figure 4:
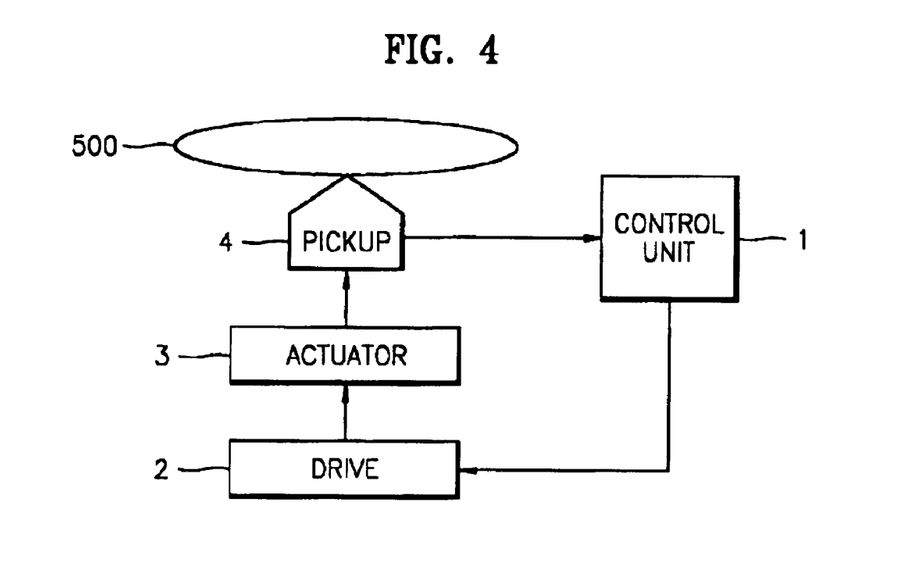
FIG. 4 is a block diagram of an optical disc drive shown in FIGS. 1 through 3.

FIG. 4 is a block diagram of an optical disc drive 300 according an aspect of the present invention. The optical disc drive 300 has a pickup 4, an actuator 3, a drive 2, and a control unit 1. The control unit 1 has a signal processing apparatus 400 which has a multi-channel A/D converter (shown in FIG. 5) according to the present invention. The pickup 4 irradiates a laser beam to the optical disc 500, and sends a plurality of analog signals to the control unit 1 based on a signal obtained by receiving the reflected laser beam. The control unit 1 sends a control signal to the drive 2. The control unit 1 obtains the control signal based on the plurality of input analog signals. According to the control signal provided by the control unit 1, the drive 2 drives the actuator 3, and the actuator 3 controls the pickup 4.

Figure 5:
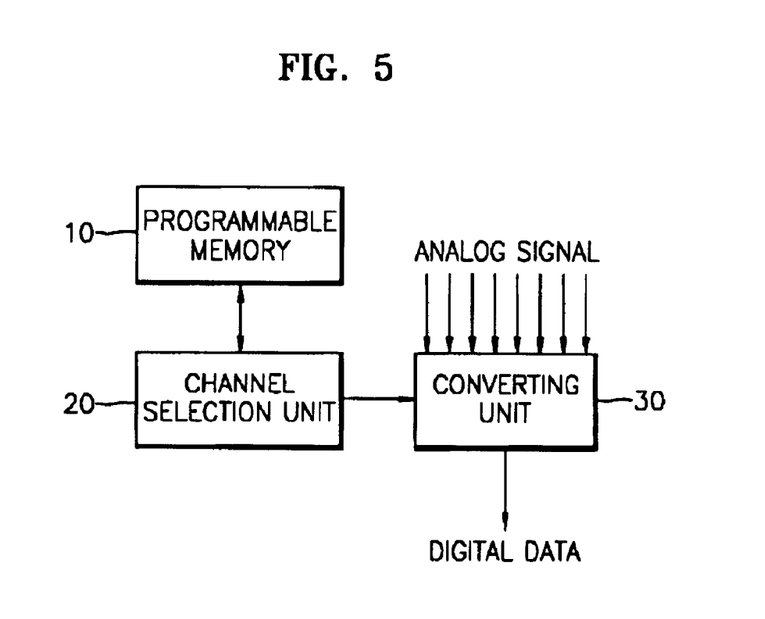
FIG. 5 is a block diagram of a multi-channel A/D converter shown in FIGS. 1 through 3.

FIG. 5 is a block diagram of a multi-channel A/D converter according to an aspect of the present invention. Referring to FIG. 5, the multi-channel A/D converter has a programmable memory 10, a channel selection unit 20, and a converting unit 30. The programmable memory 10 is a memory in which stored contents can be changed. The programmable memory 10 is implemented by a memory on which repetitive recording is possible. Examples of the programmable memory 10 include, but are not limited to, an EPROM, EEPROM, or a flash memory. The programmable memory 10 stores a table containing a channel selection order and a sampling rate. The channel selection order and the sampling rate recorded in the table can be changed by software including firmware, without changing the hardware setup.

The channel selection unit 20 selects a channel according to the channel selection order recorded in the programmable memory 10. The converting unit 30 converts an analog signal of the selected channel into digital data, and outputs the digital data.

Figure 6:
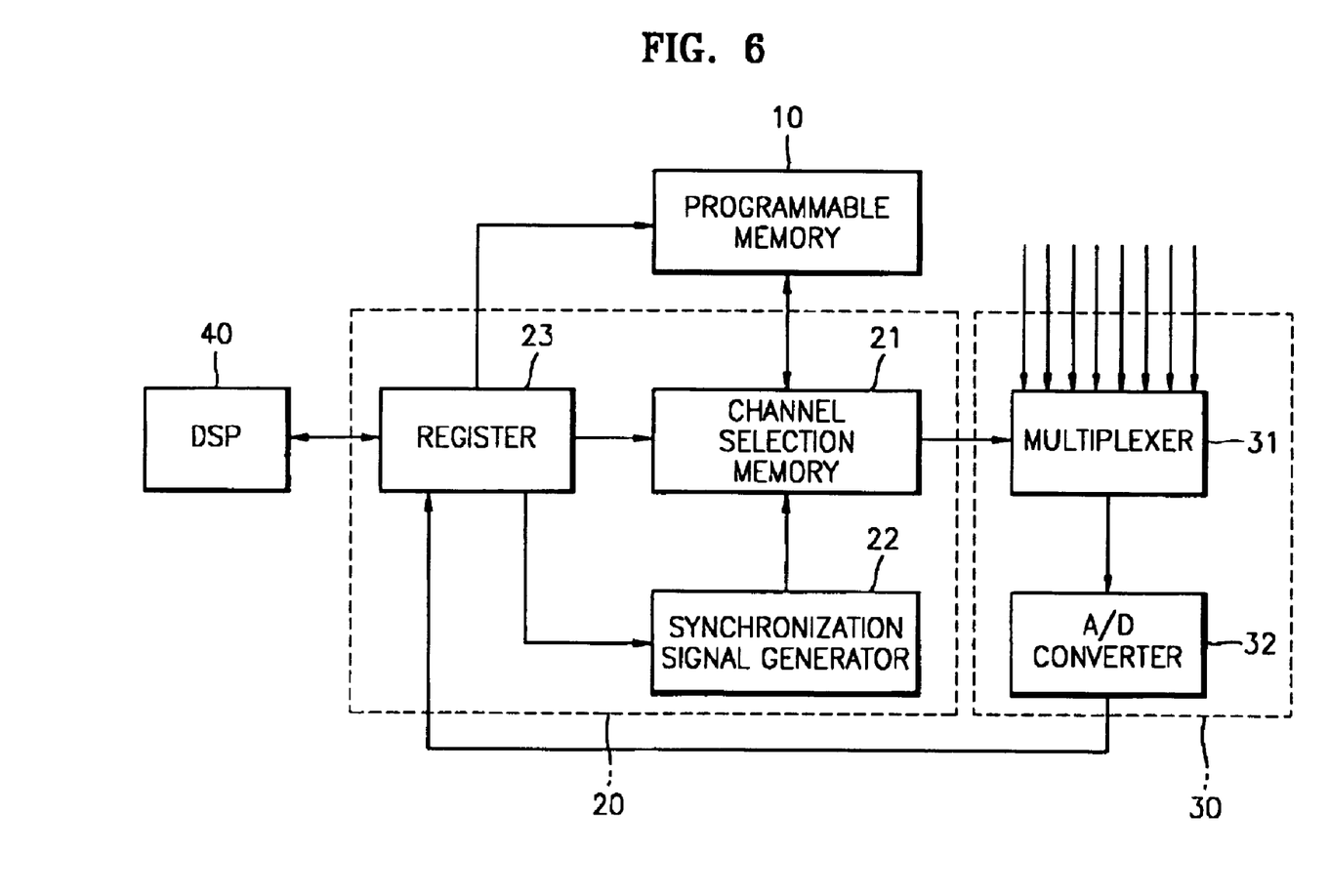
FIG. 6 is a block diagram of a signal processing apparatus shown in FIGS. 1 through 3.

FIG. 6 is a block diagram of a signal processing apparatus according to an additional aspect of the present invention. Like reference numbers are used for items having the same functions as in FIG. 5. Referring to FIG. 6, the signal processing apparatus has a multi-channel A/D converter, and a Digital Signal Processor (DSP) 40. The multi-channel A/D converter has a programmable memory 10, a channel selection unit 20, and a converting unit 30.

The programmable memory 10 is a memory in which stored contents can be changed, and is implemented by a memory on which repetitive recording is possible. Examples of the programmable memory 10 include, but are not limited to, an EPROM, EEPROM, or a flash memory. The programmable memory 10 stores a table containing a channel selection order and a sampling rate. In the shown embodiment, the table is a frame table formed with a plurality of frames. For example, a frame table can be formed with 16 3-bit frames. The channel selection order and the sampling rate recorded in the table can be changed by software (e.g., firmware) without changing the hardware setup. Unless the contents of the table are modified by the software (or firmware), the table has initial values at a hardware reset time.

In operation, the DSP 40 requests A/D conversion of an analog signal, which includes a predetermined number channels, from a multi-channel A/D converter. The DSP 40 receives converted digital data from the multi-channel A/D converter, processes the received data, and outputs a predetermined signal. In the shown embodiment, the DSP 40 orders the operation mode of the multi-channel A/D converter. The operation modes include an auto slot mode, an auto A/D clock mode, and a manual mode.

The channel selection unit 20 has a channel selection controller 21, a synchronization signal generator 22, and a register 23. It is understood that the register 23 may be separately prepared outside the channel selection unit 20. The register 23 provides a bridge between the DSP 40 and the channel selection controller 21 and the synchronization signal generator 22. Specifically, the register 23 receives and stores a control command from the DSP 40. The synchronization signal generator 20 and the channel selection controller 21 read the control command stored in the register 23, and perform corresponding operations using the read control command.

The synchronization signal generator 22 generates a synchronization signal based on a system clock signal according to the operation mode. The synchronization signal indicates the start of a unit interval for sampling digital data from an analog signal. The unit interval differs depending on the operation mode of the multi-channel A/D converter. The operation mode will be explained in detail below. Based on the provided synchronization signal, the channel selection controller 21 outputs a channel selection signal referring to the table recorded on the programmable memory 10 such that an analog signal corresponding to a channel is sampled.

Specifically, the channel selection controller 21 is responsible for an address control according to the operation mode. For example, in an automatic slot mode, the address for the frame table is increased by 1 each time a slot is to be changed, and is output as a channel selection signal. In an A/D clock mode, the address for the frame table is increased at the rising edge of an A/D clock signal, and is output. In a manual mode, the frame table is not referred to. That is, since in the manual mode the DSP 40 directly provides an address for a channel, the channel selection controller 21 passes the address from the DSP 40 to the converting unit 30.

The converting unit 30 has a multiplexer 31 and an A/D converter 32. The multiplexer 31 receives analog signals corresponding to the plurality of channels. Based on a channel selection signal input from the channel selection controller 21, the multiplexer 31 outputs an analog signal corresponding to a selected one of the channels. The A/D converter 32 converts the analog signal output from the multiplexer 31 into digital data based on the A/D clock signal provided by the A/D converter 32. Here, the A/D clock signal is usually generated based on a system clock signal. The converted digital data is stored in the register 23. The DSP 40 reads the digital data stored in the register 23.

Figure 7:
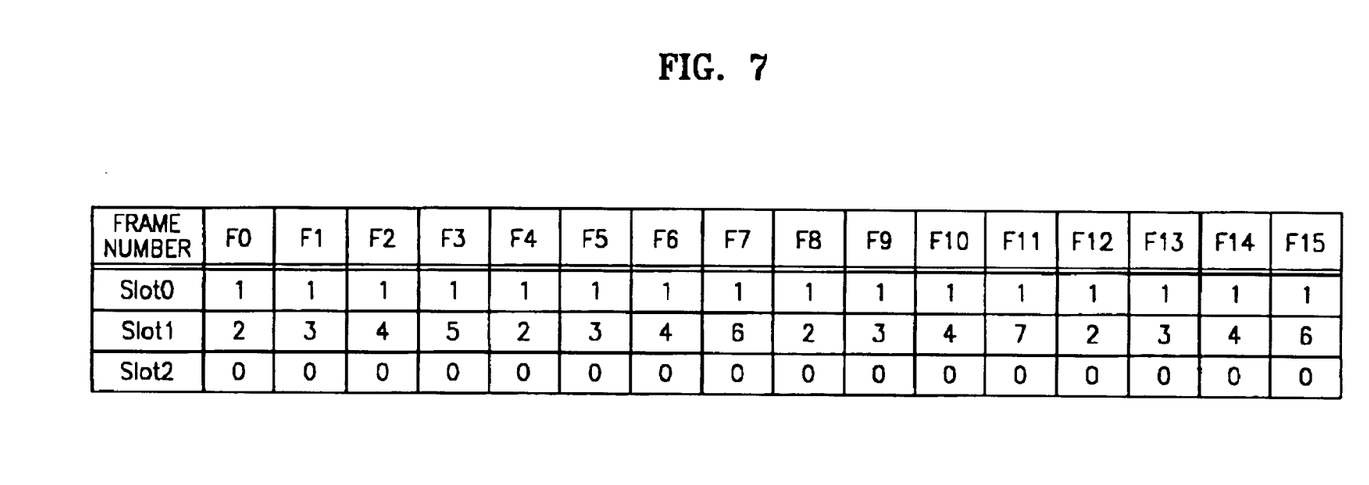
FIG. 7 is an example of a frame table stored in a programmable memory.

FIG. 7 is an example of a frame table stored in the programmable memory 10. The shown channel selection order is recorded in the frame table containing 16 3-bit frames, by way of example. If the frame table is reset to initialize the hardware, the frame table has initial values. The initial values are determined considering sampling rates of analog signals used in the optical disc drive 300.

Referring to FIG. 7, in the frame table, a frame is selected whenever a synchronization signal is generated. The 16 frames are cyclically selected (F0→F1 ... →F15→F0 ...). 1 frame means 1 sampling cycle. One frame has 3 slots: Slot0, Slot1, and Slot2. Three intervals, which are obtained when a frame is divided into 3 pieces, are sequentially assigned to Slot0, Slot1, and Slot2. Since channels 0 and 1 are selected at each frame, their sampling rates are the highest. The sampling rate of each of channels 2 through 4 is one fourth of the sampling rate of channel 0 or 1. The sampling rate of each of channels 5 through 7 is one sixteenth of the sampling rate of channel 0 or 1.

The sampling rate for each channel can be changed by recording again the rate on the frame table using firmware. If the hardware is reset, the control flag of the channel selection controller 21 is set to the automatic slot mode among the three modes (automatic slot mode, A/D clock mode, and manual mode). However, it is understood that other modes can be chosen for when the hardware is reset, and that the sampling rate for each channel can be changed using other types of software.

Figure 8:
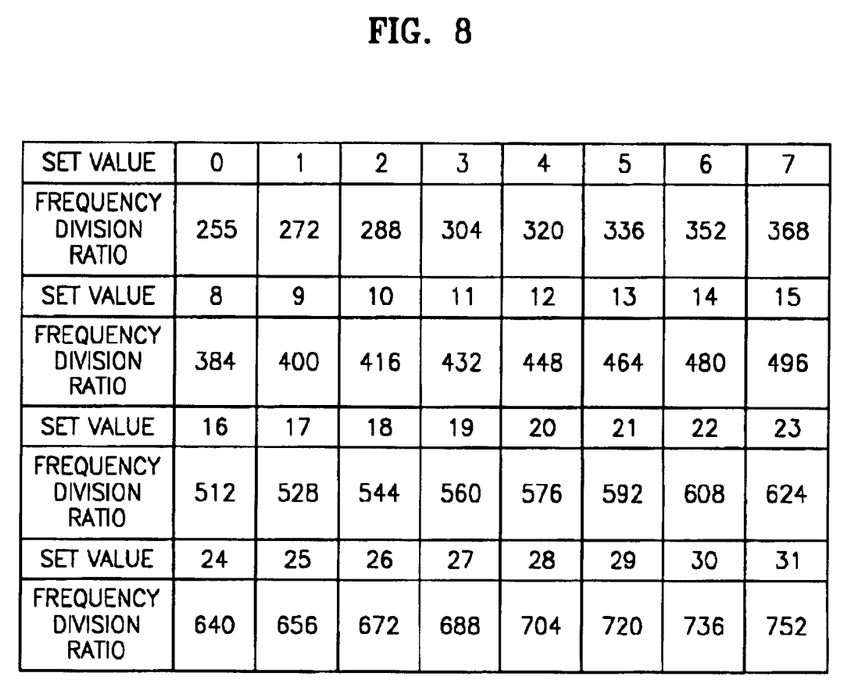
FIG. 8 is an example of frequency division ratios which are referred to by a synchronization signal generator in order to determine a sampling cycle.

FIG. 8 is an example of frequency division ratios which are referred to by the synchronization signal generator 22 in order to determine a sampling cycle. Referring to FIG. 8, the synchronization signal generator 22 can select one of 32 sampling cycles based on a system clock signal. For example, if the set value is 16, the corresponding frequency division ratio is 512, and a value obtained by multiplying the frequency of the system clock by the frequency division ratio becomes the sampling frequency. The frequency division ratio for the sampling cycle of the present embodiment is set to 512, which is a center value.

The DSP 40 can set a sampling cycle corresponding to the 255 through 752 frequency divisions of the system clock signal through the register 23. The synchronization signal generator 22 provides a synchronization signal to the channel selection controller 21 at each sampling cycle which is preset. Also, the synchronization signal generator 22 provides a slot synchronization signal, which synchronizes the sampling cycle with a slot divided into 3 pieces according to the present embodiment, to the channel selection controller 21. A slot synchronization signal is obtained by dividing a sampling rate by n after the sampling rate is determined.

Figure 9A:
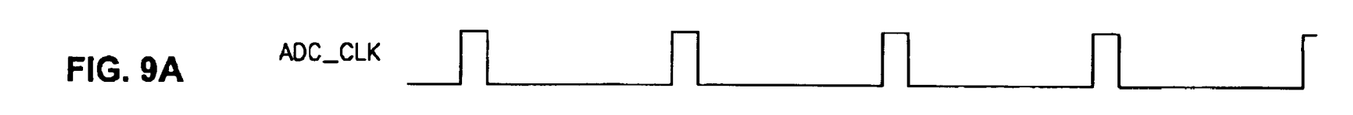
FIGS. 9A through 9F are timing diagrams for explaining an automatic A/D clock mode according to an aspect of the present invention.
Figure 9B:
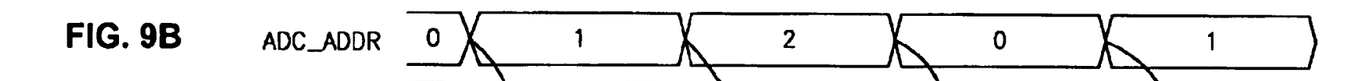
Figures 9C, 9D, 9E:
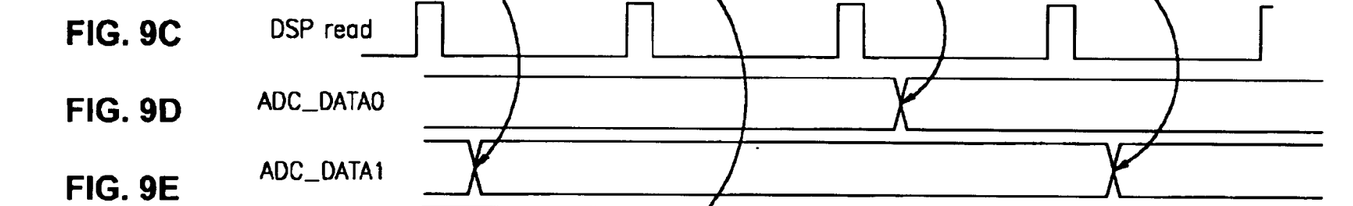
Figure 9F:
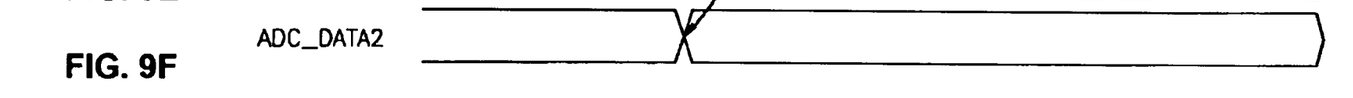
Figure 10A:
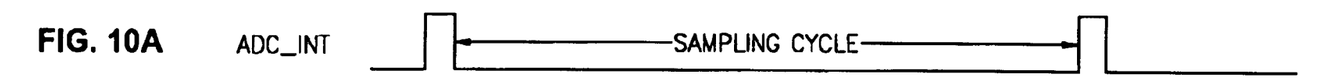
FIGS. 10A through 10I are timing diagrams for explaining an automatic slot mode according to an aspect of the present invention.
Figure 10B:
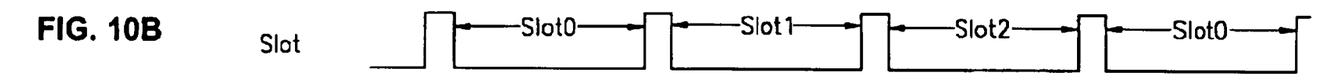
Figure 10C:
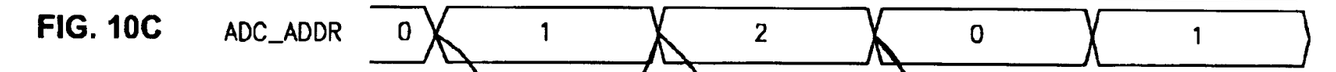
Figure 10D:
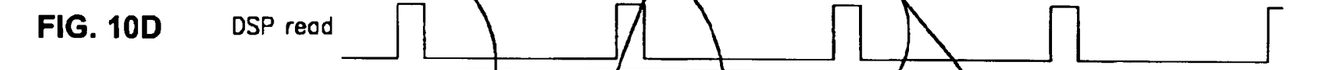
Figure 10E:
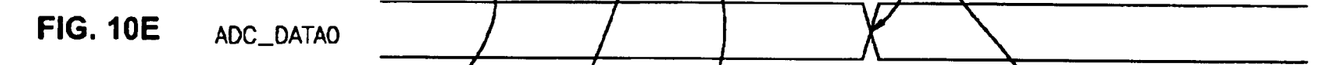
Figure 10F:
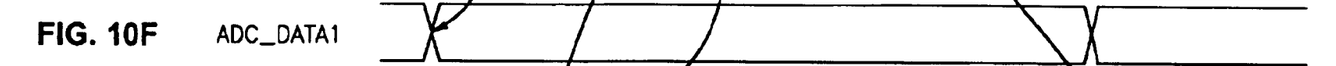
Figure 10G:
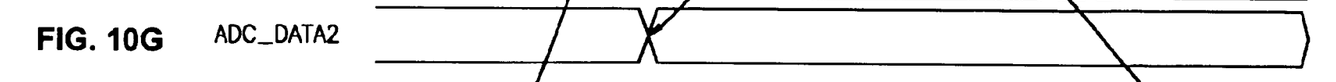
Figure 10H:
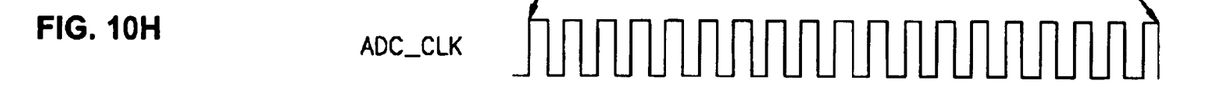
Figure 10I:
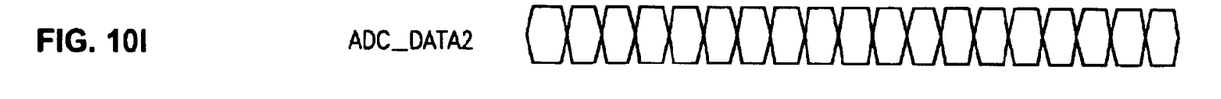
Figure 11A:
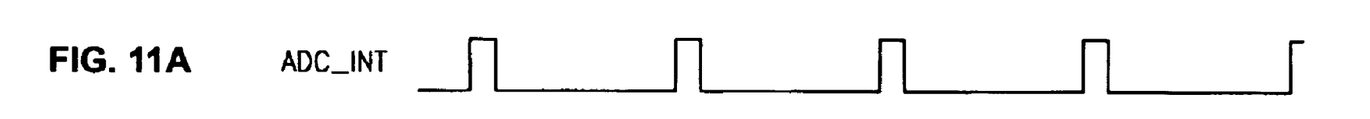
FIGS. 11A through 11D are timing diagrams for explaining a manual mode according to an aspect of the present invention.
Figure 11B:
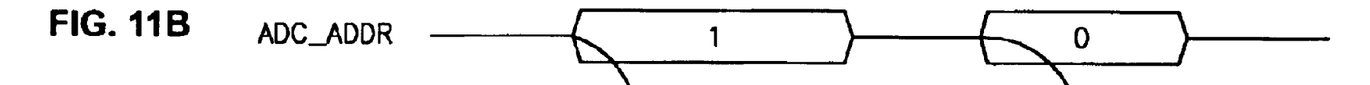
Figure 11C:
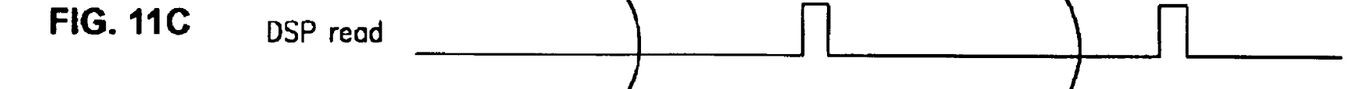
Figure 11D:
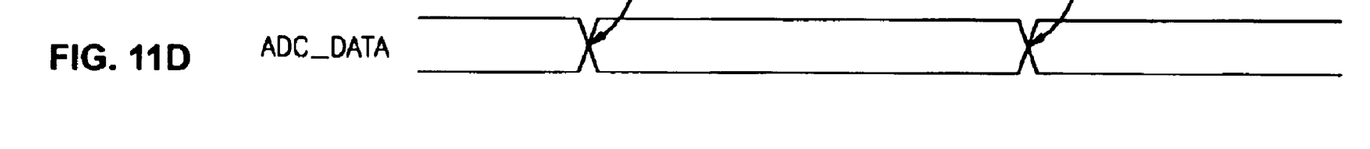

FIGS. 9A through 9F are timing diagrams for explaining an automatic A/D clock mode according to an aspect of the present invention. Referring to FIG. 9A, in the automatic A/D clock mode, the rising edge of A/D clock ADC_CLK prepared in the A/D converter 32 is used as a synchronization signal. Synchronized with the synchronization signal, the channel selection signal ADC_ADDR shown in FIG. 9B is updated. The channel selection order follows the frame table of FIG. 7. If the channel selection controller 21 sends the address of the frame table to the programmable memory 10 at the rising edge of the A/D clock signal, the channel selection order (i.e., the data indicating the order and which is recorded on the frame table as shown in FIG. 7) is sequentially output and input to the channel selection controller 21.

Digital data that is obtained at channels 0, 1, and 2 are ADC_DATA0, ADC_DATA1, and ADC_DATA2, respectively. The digital data are updated based on respective A/D clocks. The DSP 40 reads the digital data stored in the register 23 immediately before the channel selection signal ADC_ADDR is updated. Thus, in the automatic A/D clock mode, the result of A/D conversion at each channel is updated at the same speed as ADC_CLK so as to solve the problem of the time delay for a sampling cycle, which occurs in the automatic slot mode as will be explained later.

FIGS. 10A through 10I are timing diagrams for explaining an automatic slot mode according to an aspect of the present invention. In the automatic slot mode, the channel selection signal ADC_ADDR is updated in accordance with a slot synchronization signal Slot. The slot synchronization signal Slot is obtained by dividing a synchronization signal ADC_INT into equal segments. As shown, there are three segments per synchronization signal ADC_INT. The synchronization signal ADC_INT is based on the system clock ADC_CLK.

If the channel selection controller 21 sends the address of the frame table to the programmable memory 10 at the rising edge of the slot synchronization signal Slot, the channel selection order, (i.e., data indicating the order and which is recorded on the frame table as shown in FIG. 7) is sequentially output and input to the channel selection controller 21. Then, the channel selection controller 21 outputs ADC_ADDR, the address corresponding to the channel, as a channel selection signal. The digital data obtained at channels 0, 1, and 2 are ADC_DATA0, ADC_DATA1, and ADC_DATA2, respectively. As such, the digital data are updated based on respective slot synchronization signals Slot. The DSP 40 reads the digital data stored in the register 23 immediately before channel selection signal ADC_ADDR is updated.

One slot in the automatic slot mode corresponds to an integer multiple of the cycle of the A/D clock. Actually, in the A/D converter 32, the digital data corresponding to a channel is updated according to the A/D clock. It can be regarded that, in one slot in the automatic slot mode, the digital data of a single channel is continuously updated for a corresponding A/D clock.

FIGS. 11A through 11D are timing diagrams for explaining a manual mode according to an aspect of the present invention. Referring to FIGS. 11A through 11D, in the manual mode, the frame table is not referred to, and the DSP 40 directly sends the corresponding channel address ADC_ADDR of the register 23, to the channel selection controller 21. Channels to be selected for one sampling cycle ADC_INT should be selected one by one by the DSP 40 through firmware. It is understood that the channels can be selected using software other than firmware.

The multi-channel A/D converter, and the signal processing apparatus using the same described above can be embedded on one chip. Also, though the optical disc and optical disc drive are explained as examples of the embodiment described above, the present invention can be applied to a magnetic disc without any modification.

According to the present invention as described above, the multi-channel A/D converter and the system using the same are provided in which the channel selection order and sampling rate can be changed without changing the setup of the hardware, and a time delay can be reduced. In particular, the sampling rate in a process for converting an analog signal (an error signal) which is used in servo control of an optical disc drive, into digital data, can be changed by software. Also, the A/D converter is designed so that a sampling rate for each channel can be changed to maximize hardware flexibility. Thus, the A/D converter can be applied to an optical disc drive having a variety of control systems. The A/D converter has been tested using servo control chips for a DVD-RAM+DVD-R/RW and the result showed the performance improvements.

Meanwhile, since the automatic A/D clock mode operates at the sampling rate about 10 times faster than the automatic slot mode, the automatic A/D clock mode can be applied to other product groups that need a multi-channel A/D converter, as well as the optical disc drive.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A multi-channel Analog/Digital (A/D) converter comprising:
   a programmable memory which stores a channel selection order;
   a channel selection unit which selects individual channels according to the channel selection order stored in the programmable memory; and
   a converting unit which converts an analog signal of the selected channel into digital data for the selected channel wherein: a synchronization signal generators generates a synchronization signal at each cycle of an A/D clock when in an automatic A/D clock mode; and, generates a corresponding synchronization signal at each slot, with each slot corresponding to an integer multiple of a system clock, when in an automatic slot mode.

2. The multi-channel A/D converter of claim 1, wherein: the channel selection unit comprises:
   a channel selection controller which outputs a channel selection signal according to the channel selection order recorded in the programmable memory based on the synchronization signal, and
   the converting unit converts the analog signal of the selected channel according to the channel selection signal.

3. The multi-channel A/D converter of claim 2, wherein the converting unit comprises:
   a multiplexer which receives analog signals corresponding to each of the channels, and outputs the analog signal of the selected channel based on the channel selection signal; and
   an A/D converter which converts the analog signal output from the multiplexer into the digital data.

4. The multi-channel A/D converter of claim 3, wherein:
   the A/D converter generates an A/D clock signal having cycles, and
   the synchronization signal generator generates the synchronization signal at each of the cycles of the A/D clock signal.

5. The multi-channel A/D converter of claim 4, wherein:
   the synchronization signal generator generates the synchronization signal at each slot, and
   and each slot corresponds to an integer multiple of the cycle of the A/D clock signal.

6. The multi-channel A/D converter of claim 2, wherein, if the synchronization signal is input to the channel selection controller, the channel selection controller outputs an address of the selected channel corresponding to the signal as the channel selection signal.

7. The multi-channel A/D converter of claim 6, wherein the multi-channel A/D converter is included on a chip.

8. A disc drive comprising the chip of claim 7, and further comprising:
   a pickup to reproduce data with respect to a recording medium, the data including channels having analog signals;
   an actuator to move the pickup;
   a drive to drive the actuator; and
   a control unit having the chip, the control unit to control the drive and receive the data reproduced by the pickup,
   wherein the multi-channel A/D converter is embedded in the chip.

9. A reproducing apparatus comprising the disk drive of claim 8, and further comprising:
   an output device through which data reproduced by the disc drive is output.

10. The multi-channel A/D converter of claim 1, wherein, when in a manual mode, the synchronization signal generator is disabled and the channel selection controller outputs the channel selection signal according to channel selection information provided by a signal processor.

11. The multi-channel A/D converter of claim 1, wherein:
    the channel selection order comprises an array including frames which include slots, with each channel being selected according to a combination of one of the slots and one of the frames, and
    the channel selection unit individually selects the frames, and for each selected frame, sequentially selects the slots in the selected frame so as to select the corresponding channels to be converted by the converting unit.

12. The multi-channel A/D converter of claim 1, wherein the programmable memory is programmable so as to allow a change in the stored channel selection order.

13. The multi-channel A/D converter of claim 1, wherein the programmable memory is programmable so as to allow a replacement of a first channel selection order having first sampling rates for the channels with a second selection channel order having second sampling rates for the channels.

14. The multi-channel A/D converter of claim 1, wherein the programmable memory is not a read only memory.

15. A signal processing apparatus comprising:
    an A/D converter which comprises a programmable memory on which a channel selection order is recorded, a channel selection unit which selects individual channels according to the channel selection order recorded in the programmable memory, a converting unit which converts an analog signal of the selected channel into digital data of the selected channel, and a storage unit which stores the converted digital data; and
    a digital signal processor which reads the stored digital data stored in the storage unit, processes the data, and outputs a predetermined signal wherein: a synchronization signal generator generates a synchronization signal at each cycle of an A/D clock when in an automatic A/D clock mode; and, generates a corresponding synchronization signal at each slot, with each slot corresponding to an integer multiple of a system clock, when in an automatic slot mode.

16. The signal processing apparatus of claim 15, wherein the channel selection order stored in the programmable memory is changeable using the digital signal processor.

17. The signal processing apparatus of claim 16, wherein the channel selection order stored in the programmable memory is changed by changing firmware, and the digital signal processor executes portions of the firmware.

18. The signal processing apparatus of claim 15, wherein: the channel selection unit comprises:
   a channel selection controller which generates a channel selection signal according to the channel selection order recorded in the programmable memory, based on the synchronization signal, and
   the converting unit converts the analog signal of the selected channel according to the channel selection signal.

19. The signal processing apparatus of claim 18, wherein: the converting unit comprises an A/D converter which converts the analog signal of the selected channel into the digital data of the selected channel, and which prepares an A/D dock signal having cycles, and
   the synchronization signal generator generates the synchronization signal at each of the cycles of the A/D clock.

20. The signal processing apparatus of claim 18, wherein: the converting unit comprises an A/D converter which converts the analog signal of the selected channel into the digital data of the selected channel, and which prepares an A/D clock signal having cycles, and
   the synchronization signal generator generates the synchronization signal at slots, each slot corresponding to an integer multiple of the cycle of the A/D clock signal.

21. The signal processing apparatus of claim 18, wherein, when a manual mode, the synchronization signal generator is disabled and the channel selection controller outputs the channel selection signal according to channel selection information provided by the digital signal processor.

22. The signal processing apparatus of claim 18, wherein in the synchronization signal is input, the channel selection controller outputs an address of the selected channel corresponding to the channel selection signal.

23. The signal processing apparatus of claim 22, wherein the signal processing apparatus is mounted on a chip.

24. A disc drive comprising the chip of claim 23, and further comprising:
   a pickup to reproduce data with respect to a recording medium, the data comprising channels having analog signals;
   an actuator to move the pickup;
   a drive to drive the actuator; and
   a control unit having the chip, the control unit to control drive and receive the data reproduced by the pickup.

25. A reproducing apparatus comprising the disk drive of claim 24, and further comprising:
   an output device through which data reproduced by the disc drive is output.

26. The signal processing apparatus of claim 15, wherein the converting unit comprises:
   a multiplexer which receives analog signals corresponding to each of the channels, and selects and outputs the analog signal of the selected channel based on the channel selection signal; and
   an A/D converter which converts the analog signal output from the multiplexer into the digital data of the selected channel.

27. The signal processing apparatus of claim 15, wherein the storage unit further stores a command signal from the digital signal processor, where the command signal is read by the A/D converter from the storage unit.

28. The signal processing apparatus of claim 15, wherein:
   the channel selection order comprises an array including frames which include slots, with each channel being selected according to a combination of one of the slots and one of the frames, and
   the channel selection unit individually selects the frames and slots such that, for each selected frame, the channel selection unit sequentially selects the slots in the selected frame so as to select the corresponding channels to be converted by the converting unit, and when all of the slots of the selected frame have been selected, the channel selection unit selects a next frame.

29. The signal processing apparatus of claim 28, wherein, for each slot in the selected frame, the digital signal processor reads the stored digital data in the storage unit prior to the channel selection unit selecting a next slot in the selected frame or the channel selection unit selecting the next frame.

30. The signal processing apparatus of claim 29, wherein the digital signal processor reads the stored digital data in the storage unit according to a synchronization signal used by the channel selection unit to determine when to select the next slot or the next frame.

31. The signal processing apparatus of claim 15, wherein the programmable memory is programmable so as to allow a change to the stored channel selection order.

32. The signal processing apparatus of claim 15, wherein the programmable memory is programmable so as to allow a replacement of a first channel selection order having first sampling rates for the channels with a second selection channel order having second sampling rates for the channels.

33. A method of changing sampling rates of channels of having analog signals converted into digital signals using multi-channel Analog/Digital (A/D) converter, the method comprising:
   obtaining a first channel selection order having first sampling rates for the channels; and
   reprogramming a programmable memory of the A/D converter so as to replace a stored second channel selection order having second sampling rates for the channels with the first channel selection order,
   wherein the programmable memory remains in the A/D converter during the reprogramming of the programmable memory and is accessible by a channel selection unit, which uses the stored channel selection order to select individual channels such that a converting unit uses the selected channel to convert an analog signal of the selected channel into digital data for the selected channel.

34. The method of claim 33, wherein each of the first and second channel selection orders comprises an array including frames which include slots, with each channel being selected according to a combination of one of the slots and one of the frames such that, when the channel selection unit individually selects the frames, the slots in the selected frame are sequentially selected so as to select the corresponding channels to be converted by the converting unit.

* * * * *

UNITED STATES PATENT AND TRADEMARK OFFICE
CERTIFICATE OF CORRECTION

PATENT NO. : 6,788,230 B2
DATED : September 7, 2004
INVENTOR(S) : Young-Jun Ahn

It is certified that error appears in the above-identified patent and that said Letters Patent is hereby corrected as shown below:

Column 9,
Line 29, change "generators" to -- generator --.

Column 11,
Line 21, change "dock" to -- clock --.
Line 39, change "in" to -- if --.

Signed and Sealed this

Second Day of August, 2005

JON W. DUDAS
*Director of the United States Patent and Trademark Office*